(12) United States Patent
Stassar

(10) Patent No.: US 12,270,905 B2
(45) Date of Patent: Apr. 8, 2025

(54) LIGHTING DEVICE FOR FREQUENCY-MODULATED EMISSION

(71) Applicant: Lumileds LLC, San Jose, CA (US)

(72) Inventor: Emanuel Nicolaas Hermanus Johannes Stassar, Sprang Capelle (NL)

(73) Assignee: LUMILEDS, LLC, San Jose, CA (US)

(*) Notice: Subject to any disclaimer, the term of this patent is extended or adjusted under 35 U.S.C. 154(b) by 571 days.

(21) Appl. No.: 16/744,785

(22) Filed: Jan. 16, 2020

(65) Prior Publication Data

US 2020/0225352 A1    Jul. 16, 2020

(30) Foreign Application Priority Data

Jan. 16, 2019 (EP) .................................... 19152049

(51) Int. Cl.
| | |
|---|---|
| H01L 27/15 | (2006.01) |
| G01S 7/4911 | (2020.01) |
| G01S 17/34 | (2020.01) |
| G05F 3/16 | (2006.01) |
| H01L 23/00 | (2006.01) |
| H01L 25/075 | (2006.01) |
| H01L 25/16 | (2023.01) |
| H05B 33/08 | (2020.01) |
| H10H 20/857 | (2025.01) |
| H10H 20/01 | (2025.01) |

(52) U.S. Cl.
CPC ............. *G01S 17/34* (2020.01); *G01S 7/4911* (2013.01); *H01L 24/48* (2013.01); *H01L 25/0753* (2013.01); *H01L 25/167* (2013.01); *H10H 20/857* (2025.01); *H01L 2224/48137* (2013.01); *H01L 2924/12041* (2013.01); *H01L 2924/1306* (2013.01); *H10H 20/0364* (2025.01)

(58) Field of Classification Search
CPC ........ H01L 33/08; H01L 33/62; H01L 27/156
See application file for complete search history.

(56) References Cited

U.S. PATENT DOCUMENTS

| | | |
|---|---|---|
| 9,101,019 B2 | 8/2015 | Jong et al. |
| 9,185,762 B2 | 11/2015 | Mark et al. |
| 10,021,746 B2 | 7/2018 | Hilgers |

(Continued)

FOREIGN PATENT DOCUMENTS

| | | |
|---|---|---|
| WO | 2008/154736 A1 | 12/2008 |
| WO | 2013/116114 A1 | 8/2013 |
| WO | 2018/229022 A1 | 12/2018 |

OTHER PUBLICATIONS

International Preliminary Report on Patentability Chapter I issued Jun. 16, 2021 for PCT International Application No. PCT/EP2020/050208.

(Continued)

*Primary Examiner* — Kyoung Lee
*Assistant Examiner* — David J Goodwin
(74) *Attorney, Agent, or Firm* — Volpe Koenig

(57) ABSTRACT

Lighting devices and methods of manufacture are described. A lighting device includes a substrate, multiple light-emitting diodes (LEDs) on the substrate, an electronic switch on the substrate, and multiple connectors, each comprising a wire bond. Multiple wire bonds electrically couple at least two of the multiple LEDs and multiple wire bonds electrically couple the electronic switch and at least one of the plurality of LEDs.

12 Claims, 2 Drawing Sheets

(56) References Cited

U.S. PATENT DOCUMENTS

Figure 1:
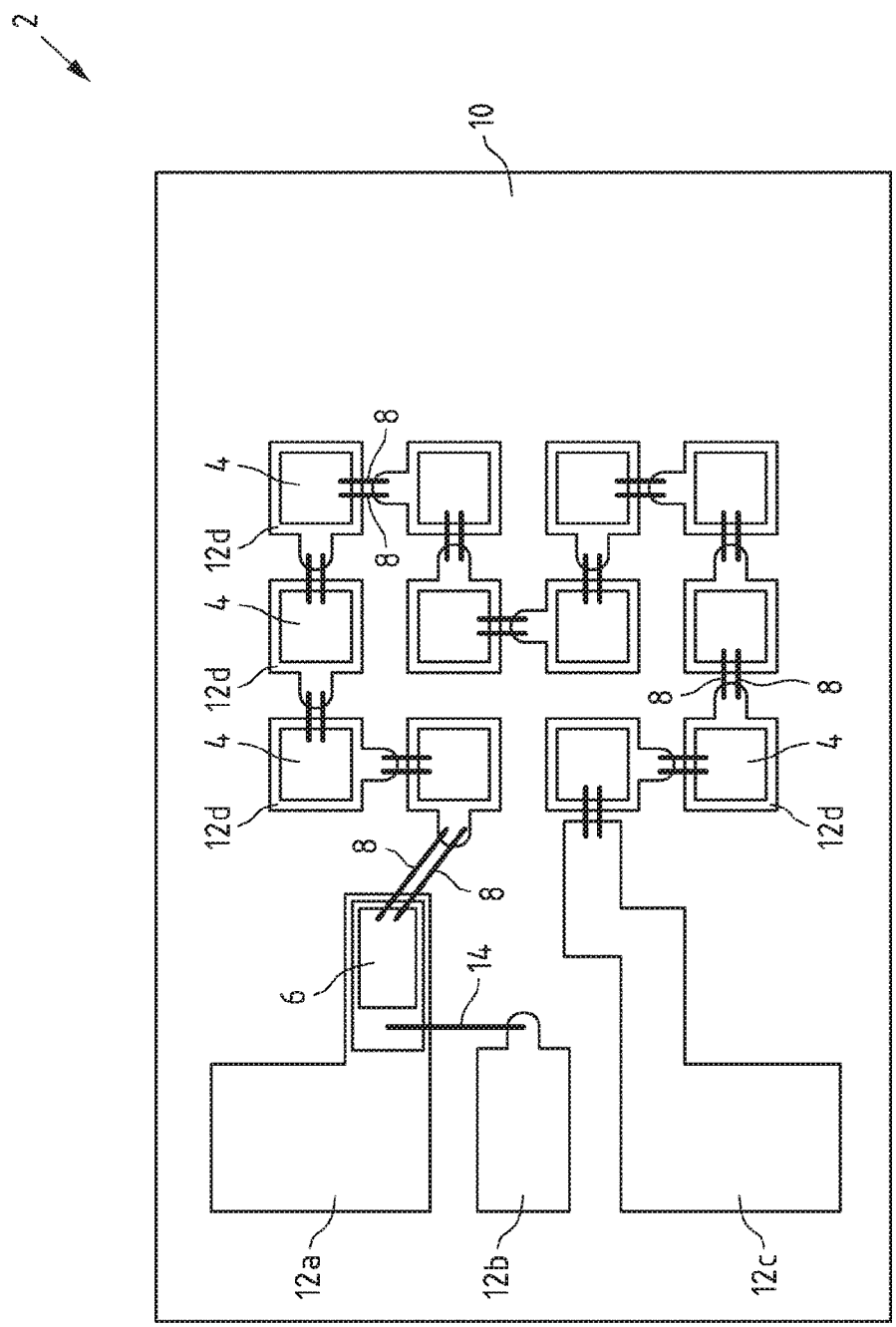

| | | | |
|---|---|---|---|
| 10,098,197 B2 | 10/2018 | Van de Ven et al. | |
| 10,732,745 B2 | 8/2020 | Fong | |
| 2005/0068459 A1* | 3/2005 | Holmes | H05B 45/375 |
| | | | 315/76 |
| 2006/0114333 A1* | 6/2006 | Gokturk | G01S 7/4868 |
| | | | 348/222.1 |
| 2006/0118807 A1 | 6/2006 | Ives et al. | |
| 2008/0258695 A1* | 10/2008 | Kumar | H05B 45/44 |
| | | | 323/223 |
| 2010/0258819 A1 | 10/2010 | Marfeld et al. | |
| 2011/0006684 A1 | 1/2011 | Hodgson et al. | |
| 2011/0163681 A1 | 7/2011 | Dau et al. | |
| 2013/0026925 A1* | 1/2013 | Ven | H05B 45/44 |
| | | | 315/122 |
| 2014/0270793 A1 | 9/2014 | Bradford | |
| 2015/0249191 A1 | 9/2015 | Takeuchi et al. | |
| 2016/0165680 A1* | 6/2016 | Johnson | F21V 23/005 |
| | | | 438/23 |
| 2016/0356428 A1* | 12/2016 | Edmond | F21K 9/238 |
| 2017/0186928 A1* | 6/2017 | Ono | H01L 33/58 |
| 2021/0293966 A1* | 9/2021 | Sakai | G01B 11/24 |

OTHER PUBLICATIONS

Extended European Search Report dated Apr. 18, 2019 for European Patent Application No. 19152049.3.
International Search Report mailed Feb. 13, 2020 for PCT International Application No. PCT/EP2020/050208.

* cited by examiner

LIGHTING DEVICE FOR FREQUENCY-MODULATED EMISSION

CROSS REFERENCE TO RELATED APPLICATION

This application claims the benefit of EP Patent Application No. 19152049.3, filed Jan. 16, 2019, which is incorporated by reference as if fully set forth.

FIELD OF INVENTION

The present disclosure relates to a lighting device for frequency-modulated emission comprising light-emitting diodes (LEDs), in particular for time of flight applications.

BACKGROUND

In time of flight applications, for example in distance measuring and 3D imaging, a frequency-modulated emission of light by a lighting device may be used. Here, lighting devices may provide frequency-modulated light with operation frequencies in the MHz range. For example, laser light sources have widespread application in time of flight measurements, for instance in lidar.

LEDs are also suitable for generating frequency-modulated light, wherein multiple LEDs may be driven with an oscillating driving current. Typically, the oscillating driving current is provided by controlling switching means such as a field-effect transistor. The field-effect transistor may receive an input signal at its gate, the input signal being provided by an external source. The input signal periodically opens and closes the field-effect transistor. The field-effect transistor may then provide an oscillating current to induce a frequency-modulated emission of light by the LEDs.

High operating frequencies of the LEDs are desirable to improve the accuracy in time of flight measurements. Further, to enhance the emitted intensity, high power LEDs that require large currents may be used, with currents of several amperes being reached for larger arrangement of LEDs. Therefore, it can be challenging to provide a layout of the electrical connections between the elements of such lighting devices that allows a stable and controlled driving of the LEDs also at higher frequencies. In particular, capacitances and inductances in the lighting device have a substantial effect on the operation of the lighting device.

SUMMARY

It is an object of the present invention to provide a lighting device for frequency-modulated emission comprising LEDs that allows for higher operating frequencies and also a simplified layout of the electronic components. The invention further relates to a method for producing a lighting device and a use of such a lighting device based on the aforementioned object.

According to a first aspect of the present invention, a lighting device for frequency-modulated emission is provided, the lighting device comprising: multiple light-emitting LEDs; electronic switching means; connection elements, wherein the connection elements provide electrical connection between the LEDs and the electronic switching means; characterized in that a common substrate is provided, wherein the common substrate is configured as an integrated element, wherein the LEDs and the electronic switching means are fixed on the common substrate.

According to a second aspect of the present invention, a method for producing a lighting device for frequency-modulated emission is provided, the method comprising: providing a common substrate is provided, wherein the common substrate is configured as an integrated element, fixing multiple light-emitting diodes on the common substrate; fixing electronic switching means on the common substrate; providing electrical connection between the LEDs and the electronic switching means by means of connection elements. The method according to the second aspect is in particular for producing a lighting device according to the first aspect.

According to a third aspect of the present invention, a use of a lighting device according to the first aspect in time of flight applications is provided.

Exemplary embodiments of the first, second, and third aspect of the invention may have one or more of the properties described below.

The LEDs for the lighting device may each comprise at least one semiconductor element such as a p-n-junction. For instance, an LED may be provided in form of an LED die and/or an LED package. Multiple LEDs are provided, wherein in particular the LEDs are of the same type.

The LEDs are used in the lighting device for frequency-modulated emission. That is, when the lighting device is operated, the LEDs may be subject to a (periodically) oscillating driving current, causing the LEDs to emit light with an amplitude that is modulated by the oscillation of the driving current. The switching means is configured to provide the LED with the oscillating driving current, e.g. in that the switching means is controlled by an external oscillating signal with a desired operating frequency.

Connection elements are provided for electrical connection between the LEDs and the electronic switching means. That is, the LEDs and the electronic switching means are interconnected by the connection elements to form at least part of an electronic circuit. The electronic circuit may be configured to enable providing an oscillating driving current to the LEDs for frequency-modulated light emission, e.g. in that a power source and a source for the oscillating input signal is connected to the electronic switching means.

According to the invention, a common substrate is provided, wherein the common substrate is configured as an integrated element. That is, the common substrate is a single (continuous) element that provides surfaces for mounting the LEDs and the electronic switching means. The LEDs and optionally the electronic switching means are in particular arranged on the same side of the common substrate. The LEDs and the electronic switching means are fixed on the common substrate, effectively leading to an integration of the LEDs and the electronic switching means to a single element.

This leads to an advantageous arrangement in respect to the electronic properties of the lighting device. In particular, as the connection distances and connection elements may be kept as short as possible due to the integrated arrangement on the common substrate, wherein inter alia the capacitance of the electronic circuit is significantly reduced, leading to higher maximum operation frequencies. Further, shorter rise and fall times of light pulses generated by the lighting device may be obtained.

The distance between the LEDs and the electronic switching means may be minimized in contrast to previous arrangements with an electronic switching means being provided as separate element from the LEDs. As the common substrate may also act as heat sink, the heat dissipation of the LEDs may be improved, which is particularly advantageous when high power LEDs are utilized, for example in time of flight applications.

The common substrate may for example comprise or consist of ceramics. Ceramic materials may provide high thermal conductivity and electrical insulating properties. The common substrate may have a board-like shape and is in particular configured as a circuit board, e.g. a printed circuit board. The common substrate may also be a multilayer sheet, e.g. with a ceramics core or a metallic core for high thermal conductivity and conductive tracks being provided on one or more surfaces of the common substrate to form at least part of the connection elements. The common substrate may be configured as or comprise a lead frame.

The LEDs and/or the electronic switching means may at least partially encased and/or embedded on the common substrate. For instance, the LEDs and/or the electronic switching means may be overmoulded, for instance with a plastics material. In particular, the LEDs (and optionally in addition the electronic switching means) is overmoulded in silicone, wherein the overmoulded silicone may form an optical element such as a refractive element, diffusive element and/or a filter for the LEDs.

In an exemplary embodiment according to the invention, the LEDs are arranged adjacent to each other. That is, each LED may be arranged directly next to another LED (i.e. in mechanical contact or almost in mechanical contact) or be arranged very closely to each other (e.g. the distance between nearest neighbouring LEDs is smaller than a lateral extension of a single LED). Hence, the distance between the LEDs is minimized. Further, the electronic switching means may also be arranged adjacent to at least one LED, in particular in direct mechanical contact or at a distance that is smaller than a lateral extension of a single LED. In addition, the connection elements may each be formed between the nearest neighbouring LEDs/between the electronic switching means and the closest LED, such that the connection elements may have a length that is as short as possible.

The LEDs may be arranged such that the LEDs form a matrix of LEDs, i.e. a two-dimensional regular or irregular arrangement of LEDs. For instance, the LEDs may be arranged in a rectangular matrix or array, such as a 2×4 or 3×4 matrix. The matrix of LEDs may provide for a substantially homogeneous illumination with an increased intensity of emitted light.

In another exemplary embodiment according to the invention, the connection elements comprise wire bonds. Wire bonds allow for a particularly simple production of the lighting device in that the LEDs and the electronic switching means may be connected by wire bonding the respective elements.

In particular, in an embodiment, between at least two LEDs, multiple connection elements are provided; and/or between the electronic switching means and at least one LED, multiple connection elements are provided. For instance, multiple wire bonds, e.g. two, four or more wire bonds are provided between respective elements. Hence, the resistance and capacitance resulting from the connection elements may be controlled in a simple manner, wherein in particular the capacitance may be reduced to enable higher operating frequencies of the lighting device.

In another exemplary embodiment according to the invention, the connection elements are at least partially formed by conductive tracks of the common substrate. As already mentioned above, the common substrate may be configured as (printed) circuit board with an optional core. The conductive tracks may be embedded in the common substrate and/or arranged on a surface of the common substrate. In particular, the conductive tracks may also form contact patches for the LEDs and/or the electronic switching means. In an embodiment, the conductive tracks form contact patches for an electrical connection to a power source, e.g. to provide voltage to the electronic switching means. Further, a gate contact patch may be provided for the electronic switching means, which may be used to provide the electronic switching means with an oscillating input signal.

Further, the conductive tracks of the common substrate form at least one anode track and/or at least one cathode track. The anode track/cathode track is configured to connect at least some of the multiple LEDs at the same time. That is, the anodes of several or all LEDs are connected to the same anode track and/or the cathodes of several or all LEDs are connected to the same cathode track. The anode and/or cathode tracks therefore allow for a simple setup and production of the lighting device, in particular by means of surface mounting technology. At least one of the electrodes of the LEDs may be provided at the surface of the LEDs on which the LEDs are mounted, wherein the LEDs are directly fixed in an electrically conductive manner to the anode and/or cathode track.

In an embodiment of the invention, the at least one anode track and/or at least one cathode track at least partially surrounds the LEDs on the common substrate. For instance, the LEDs are arranged adjacent to each other on the cathode track, being in electrical contact to the cathode track with the respective cathodes. The anode track may at least partially surround the LEDs, i.e. the anode track at least partially reaches around the arrangement of LEDs, allowing for a simple contacting of the LEDs, e.g. with wire bonds having a comparably short length. Vice versa, it is also possible that the the LEDs are arranged adjacent to each other on the anode track, being in electrical contact to the anode track with the respective anodes. The cathode track may then at least partially surround the LEDs.

In principle, the connection elements may be used to provide any kind of serial connection, parallel connection or combination of serial and parallel connections for the LEDs and the electronic switching means. In an exemplary embodiment according to the invention, the LEDs are connected in parallel to each other by the connection elements. That is, all LEDs of the lighting device may be connected in parallel. Such an electrical connection may efficiently be produced by means of the aforementioned anode track and/or cathode track. A parallel connection of the LEDs has the advantage that when the LEDs are driven with high currents and fast rise times of the current, a possible time delay between individual LEDs is minimized.

The electronic switching means may for example comprise at least one bipolar junction transistor, operational amplifier, and/or vacuum tube. In an exemplary embodiment according to the invention, the electronic switching means comprise at least one field-effect transistor. Field-effect transistors and in particular metal oxide semiconductor field-effect transistors are particularly suitable for providing a driving current for the LEDs in the MHz range.

In preferred embodiments of the invention, the lighting device is configured for use in time of flight applications. For example, distance measurements may be performed on basis of the frequency-modulated light emitted by the inventive lighting device. The lighting device may for instance be integrated into automotive autonomous cars, sensors for drones (such as obstacle avoidance systems), automotive driver monitoring systems, and/or automotive gesture control systems. Further applications are mobile 3D sensors and gaming, for example virtual reality and/or augmented reality games.

The features and example embodiments of the invention described above may equally pertain to the different aspects according to the present invention. In particular, with the disclosure of features relating to the lighting device according to the first aspect, also corresponding features relating to the method according to the second aspect and the use according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Figure 2:
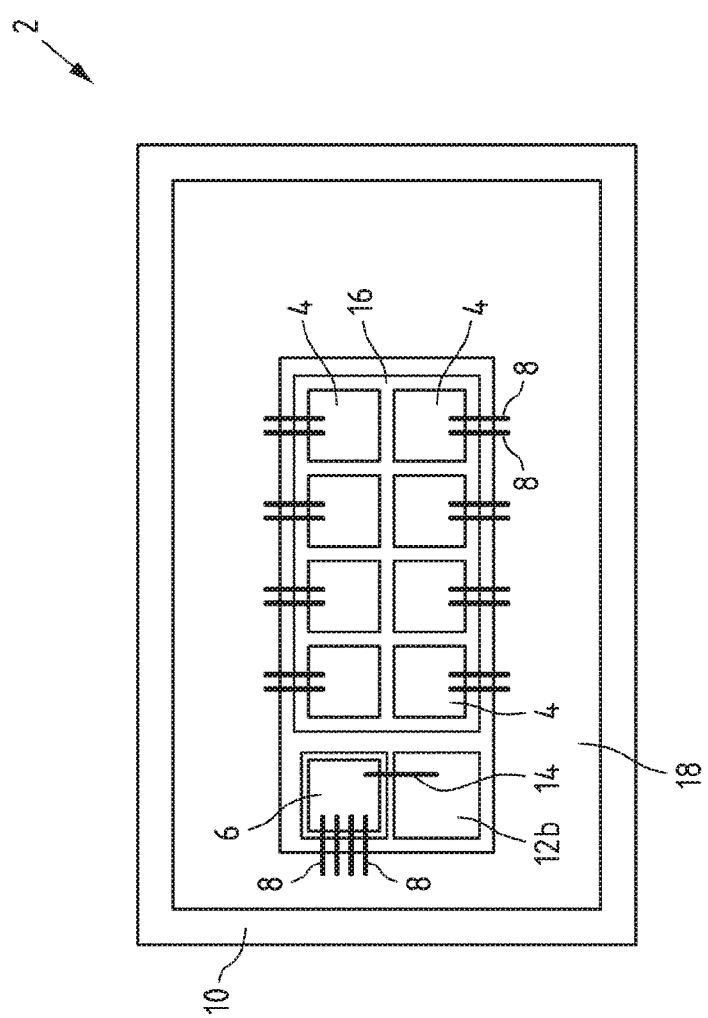

Examples of the invention will now be described in detail with reference to the accompanying drawing, in which:

FIG. 1 shows a schematic representation of a first embodiment of a lighting device according to the invention; and FIG. 2 shows a schematic representation a second embodiment of a lighting device according to the invention.

DETAILED DESCRIPTION OF THE PREFERRED EMBODIMENT(S)

FIG. 1 shows a schematic representation of a first embodiment of a lighting device 2 according to the invention. Multiple LEDs 4 are arranged in a 3×4 matrix. A field effect transistor is provided as electronic switching means 6. Further, connection elements comprising wire bonds 8 provide electrical connection between the LEDs 4. The connection elements also connect the electronic switching means 6 and one of the LEDs 4. For each interconnection, two wire bonds 8 are provided. It can be seen from FIG. 1 that the LEDs 4 are all connected in series in this embodiment.

A common substrate is configured as an integrated element, in that the common substrate 10 comprises printed circuit board with a metal core or a ceramic core and is formed as a single element. The LEDs 4 and the electronic switching means 6 are fixed on the common substrate 10, allowing for a compact arrangement of all components with significantly reduced dimension of the wire bonds 8.

The common substrate 10 comprises contact patches 12a, 12b, 12c, and 12d. Contact patches 12a, 12c may be used for connection to a power source to provide a voltage that can be switched by the electronic switching means 6. Contact patch 12b is connected to the gate of electronic switching means 6 by means of a wire bond 14. A source providing an oscillating input signal may be connected to the contact patch 12b to control the electronic switching means 6 to open and close in an oscillating manner.

Each of the LEDs 4 is arranged on a contact patch 12d. In this embodiment, the anode of each of the LEDs 4 is situated on the side of the LEDs 4 that is mounted on the contact patch 12d. The cathode of the LEDs 4 is situated on the opposite side, which also forms the side of the LEDs 4 from which the light is emitted. The anodes are in direct electrical contact to the contact patches 12d, while the cathodes are connected by the wire bonds 8 to an adjacent contact patch 12d. In other embodiments, the arrangement of cathodes and anodes may be reversed and the LEDs 4 may be mounted with the respective cathodes on the contact patches 12d, while the anode is contacted by wire bonds 8.

The contact patches 12d form conductive tracks on the common substrate 10. The conductive tracks form the connection elements in combination with the wire bonds 8.

With the arrangement of the LEDs 4 and the electronic switching means 6 on the common substrate 10, the connection distances are minimized and therefore the connection elements may be kept short, causing low capacitances in the electronic circuit. This may lead to higher maximum operation frequencies of the lighting device 2, as well as resulting in shorter rise and fall times of light pulses generated by the lighting device 2. The arrangement on the common substrate 10 also improves heat dissipation from the LEDs 4.

These advantages make the lighting device 2 useful for time of flight applications, e.g. distance measurements for automotive autonomous cars, drones, automotive driver monitoring and automotive gesture control.

FIG. 2 shows a schematic representation a second embodiment of a lighting device 2 according to the invention. The same reference numerals have been used for corresponding elements as in FIG. 1.

In this embodiment, the LEDs 4 form a 2×4 matrix for frequency-modulated emission of light. A field-effect transistor is used as electronic switching means 6, with a contact patch 12b being connected to the gate of the electronic switching means 6 by a wire bond 14.

The electronic switching means 6 is further connected to a cathode track 18 by four wire bonds 8. The LEDs 4 are arranged together on an anode track 16 of the common substrate 10, with a direct electrical contact of each of the anodes of the LEDs 4 being established to the anode track 16. The cathodes of the LEDs 4 are each connected to the cathode track 18 by means of two wire bonds 8. The connection of the cathode track 18 to the cathodes of the LEDs 4 by means of the wire bonds 8 is simplified in that the cathode track 18 surrounds the LEDs 4 on the common substrate 10, such that the length of the wire bonds 8 may be reduced. A different orientation of the anodes and cathodes is possible, e.g. the arrangement of cathodes, anodes as well as the anode track 16 and cathode track 18 may be reversed.

The arrangement of LEDs and connection elements results in a parallel connection of all the LEDs 4 in the lighting device 2. The parallel connection of the LEDs 4 may allow for an operation of the lighting device 2 with high currents and fast rise times of the current, while minimizing a time delay in between individual LEDs 4.

What is claimed is:

1. A lighting device comprising:
a substrate;
a string of first electrode patches disposed on the substrate in a two-dimensional grid, the string comprising a beginning electrode patch, an ending electrode patch, and a plurality of intervening electrode patches between the beginning and ending electrode patches;
a second electrode patch adjacent the beginning electrode patch;
a plurality of light-emitting diodes (LEDs), wherein each one of the plurality of LEDs comprises a cathode and an anode, and a same one of the cathode or the anode of each of the plurality of LEDs is disposed directly on a respective one of the first electrode patches;
an electronic switch on the second electrode patch;
a plurality of first wire bonds electrically coupled between the anode or the cathode of a respective one of the plurality of LEDs that is not disposed directly on a respective one of the first electrode patches and an adjacent one of the first electrode patches; and
a plurality of second wire bonds electrically coupled between the second electrode patch and the beginning electrode patch in the string such that only the beginning electrode patch in the string is electrically coupled to the electronic switch via wire bonds.

2. The lighting device according to claim 1, wherein the plurality of first wire bonds electrically couple the plurality of LEDs in series.

3. The lighting device according to claim 1, wherein the electronic switch comprises at least one field-effect transistor.

4. The lighting device according to claim 1, further comprising a third contact patch electrically coupled to a gate of the electronic switch via a single third wire bond.

5. The lighting device of claim 1, wherein the first plurality of wire bonds comprises two wire bonds and the second plurality of wire bonds comprises two wire bonds.

6. The lighting device of claim 1, wherein the second electrode patch is electrically coupled to an oscillating input for the electronic switch.

7. The lighting device of claim 1, further comprising:
a fourth electrode patch on the substrate adjacent the ending electrode patch in the string and electrically coupled to a power source;
a plurality of fourth wire bonds electrically coupled between the fourth electrode patch and the ending electrode patch in the string.

8. The lighting device of claim 1, wherein the electronic switch and the beginning electrode patch in the string are spaced apart at a distance smaller than a lateral extension of a single one of the plurality of LEDs.

9. The lighting device of claim 1, wherein the electronic switch is in direct mechanical contact with the LED disposed on the beginning electrode patch in the string.

10. The lighting device of claim 1, wherein each of the plurality of LEDs is spaced apart from any immediately adjacent one of the plurality of LEDs by a distance smaller than a lateral extension of a single one of the plurality of LEDs.

11. The lighting device of claim 1, wherein each of the plurality of LEDs is in direct mechanical contact with any immediately adjacent one of the plurality of LEDs.

12. A time of flight system comprising:
a time of flight sensor; and
a lighting device comprising:
a substrate;
a string of first electrode patches disposed on the substrate in a two-dimensional grid, the string comprising a beginning electrode patch, an ending electrode patch, and a plurality of intervening electrode patches between the beginning and ending electrode patches;
a second electrode patch adjacent the beginning electrode patch;
a plurality of light-emitting diodes (LEDs), wherein each one of the plurality of LEDs comprises a cathode and an anode, and a same one of the cathode or the anode of each of the plurality of LEDs is disposed directly on a respective one of the first electrode patches;
an electronic switch on the second electrode patch; and
a plurality of first wire bonds electrically coupled between the anode or the cathode of a respective one of the plurality of LEDs that is not disposed directly on a respective one of the first electrode patches and an adjacent one of the plurality of electrode patches; and
a plurality of second wire bonds electrically coupled between the second electrode patch and the beginning electrode patch in the string such that only the beginning electrode patch in the string is electrically coupled to the electronic switch via wire bonds.

* * * * *